(12) United States Patent
Kim et al.

(10) Patent No.: US 9,349,713 B2
(45) Date of Patent: May 24, 2016

(54) SEMICONDUCTOR PACKAGE STACK STRUCTURE HAVING INTERPOSER SUBSTRATE

(71) Applicants: Jong-Kook Kim, Hwaseong-si (KR); Byoung-Wook Jang, Hwaseong-si (KR)

(72) Inventors: Jong-Kook Kim, Hwaseong-si (KR); Byoung-Wook Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/668,948

(22) Filed: Mar. 25, 2015

(65) Prior Publication Data
US 2016/0027764 A1    Jan. 28, 2016

(30) Foreign Application Priority Data
Jul. 24, 2014   (KR) .................. 10-2014-0094211

(51) Int. Cl.
*H01L 23/02*   (2006.01)
*H01L 25/11*   (2006.01)

(52) U.S. Cl.
CPC ....... *H01L 25/117* (2013.01); *H01L 2225/1058* (2013.01)

(58) Field of Classification Search
CPC .................................................. H01L 25/117
USPC ........................................................ 257/686
See application file for complete search history.

(56) References Cited

U.S. PATENT DOCUMENTS

| | | |
|---|---|---|
| 6,335,491 B1 | 1/2002 | Alagaratnam et al. |
| 6,492,715 B1 | 12/2002 | Markovich et al. |
| 6,618,938 B1 | 9/2003 | Alagaratnam et al. |
| 6,861,288 B2 | 3/2005 | Shim et al. |
| 6,913,952 B2 | 7/2005 | Moxham et al. |
| 6,989,296 B2 | 1/2006 | Huang et al. |
| 7,075,177 B2 | 7/2006 | Oka et al. |
| 7,078,823 B2 | 7/2006 | Thurgood |
| 7,102,217 B2 | 9/2006 | Thurgood |
| 7,129,584 B2 | 10/2006 | Lee |
| 7,129,586 B2 | 10/2006 | Kashiwazaki |
| 7,189,593 B2 | 3/2007 | Lee |
| 7,211,883 B2 | 5/2007 | Oka et al. |
| 7,349,224 B2 | 3/2008 | Ohsaka |
| 7,495,928 B2 | 2/2009 | Ohsaka |
| 7,608,921 B2 | 10/2009 | Pendse |
| 7,626,254 B2 | 12/2009 | O et al. |
| 7,642,633 B2 | 1/2010 | Hirose et al. |
| 7,696,006 B1 | 4/2010 | Hoang et al. |
| 7,812,440 B2 | 10/2010 | Yamazaki et al. |
| 7,838,334 B2 | 11/2010 | Yu et al. |
| 7,839,652 B2 | 11/2010 | Ohsaka |
| 7,843,047 B2 | 11/2010 | Kuan et al. |

(Continued)

FOREIGN PATENT DOCUMENTS

KR    20090091488 A    8/2009

*Primary Examiner* — Long K Tran
(74) *Attorney, Agent, or Firm* — Renaissance IP Law Group LLP

(57) ABSTRACT

Provided is a semiconductor package stack structure. The semiconductor package stack structure includes a lower semiconductor package, an interposer substrate disposed on the lower semiconductor package and having a horizontal width greater than a horizontal width of the lower semiconductor package, an upper semiconductor package disposed on the interposer substrate, and underfill portions filling a space between the lower semiconductor package and the interposer substrate and surround side surfaces of the lower semiconductor package.

20 Claims, 19 Drawing Sheets

(56) References Cited

U.S. PATENT DOCUMENTS

| | | |
|---|---|---|
| 7,964,957 B2 | 6/2011 | Noguchi et al. |
| 7,994,626 B2 * | 8/2011 | Pendse .................. H01L 21/563 257/686 |
| 8,089,142 B2 | 1/2012 | Brooks |
| 8,093,726 B2 | 1/2012 | Park |
| 8,116,097 B2 | 2/2012 | Love et al. |
| 8,258,612 B2 | 9/2012 | Kuan et al. |
| 8,411,450 B2 | 4/2013 | Yamazaki et al. |
| 8,450,825 B2 | 5/2013 | Limaye et al. |
| 8,476,117 B2 | 7/2013 | Brooks |
| 8,519,537 B2 | 8/2013 | Jeng et al. |
| 8,531,043 B2 | 9/2013 | Ha et al. |
| 8,535,981 B2 | 9/2013 | Ko et al. |
| 8,653,676 B2 | 2/2014 | Kim et al. |
| 2004/0200063 A1 | 10/2004 | Thurgood |
| 2005/0104196 A1 | 5/2005 | Kashiwazaki |
| 2005/0263873 A1 | 12/2005 | Shoji |
| 2006/0175695 A1 | 8/2006 | Lee |
| 2006/0220257 A1 | 10/2006 | Lee |
| 2007/0063336 A1 | 3/2007 | Hase |
| 2008/0136003 A1 | 6/2008 | Pendse |
| 2008/0237856 A1 | 10/2008 | Hisada et al. |
| 2010/0148335 A1 | 6/2010 | Mikami et al. |
| 2011/0103030 A1 | 5/2011 | Cases et al. |
| 2011/0278739 A1 | 11/2011 | Lai et al. |
| 2011/0291294 A1 | 12/2011 | Kim et al. |
| 2012/0020040 A1 * | 1/2012 | Lin .................... H01L 25/0652 361/772 |
| 2012/0187562 A1 | 7/2012 | Hisada et al. |
| 2012/0187578 A1 | 7/2012 | Li |
| 2012/0228753 A1 * | 9/2012 | Ko ..................... H01L 23/3128 257/667 |
| 2013/0127054 A1 | 5/2013 | Muthukumar et al. |
| 2013/0161808 A1 | 6/2013 | Kim et al. |
| 2013/0168842 A1 | 7/2013 | Park et al. |
| 2013/0223010 A1 | 8/2013 | Shioga et al. |
| 2013/0224891 A1 | 8/2013 | Takizawa |
| 2013/0252378 A1 | 9/2013 | Jeng et al. |
| 2013/0279134 A1 | 10/2013 | Hayashi et al. |
| 2014/0027926 A1 | 1/2014 | Chen et al. |
| 2014/0035097 A1 | 2/2014 | Lin et al. |
| 2014/0035114 A1 | 2/2014 | Gogoi et al. |
| 2014/0084484 A1 | 3/2014 | Chan et al. |
| 2014/0252561 A1 * | 9/2014 | Lisk .................... H01L 23/5384 257/621 |

* cited by examiner

SEMICONDUCTOR PACKAGE STACK STRUCTURE HAVING INTERPOSER SUBSTRATE

CROSS-REFERENCE TO RELATED APPLICATION

This application claims priority under 35 U.S.C. §119 to Korean Patent Application No. 10-2014-0094211 filed on Jul. 24, 2014, the disclosure of which is hereby incorporated by reference in its entirety.

BACKGROUND

1. Technical Field

Embodiments of the inventive concept relate to a semiconductor package stack structure having an interposer substrate.

2. Description of Related Art

As electronics industry technology advances, the demands on functionalization and miniaturization of the electronic components are increasing. As a result of this trend, a stack package having a number of chips mounted on a single substrate has been introduced, and a package-on-package (PoP) for fulfilling demands of a high performance and high density package has been introduced.

A lower package has become smaller as a circuit line width of a logic device has become smaller, whereas an upper package has a tendency of maintaining a standard based on semiconductor standard regulations in the above-described PoP structure. Therefore, the necessity of a PoP structure having a size of the lower package smaller than a size of the upper package has arisen.

SUMMARY

Embodiments of the inventive concept provide a semiconductor package stack structure capable of simultaneously reducing a size of a lower semiconductor package and easily bonding the lower semiconductor package to an upper semiconductor package in different sizes.

Other embodiments of the inventive concept provide a method of fabricating the semiconductor package stack structure.

Other embodiments of the inventive concept provide a module including the semiconductor package stack structure.

Other embodiments of the inventive concept provide electronic systems including the semiconductor package stack structure.

Other embodiments of the inventive concept provide a mobile wireless phone including the semiconductor package stack structure.

In accordance with an aspect of the inventive concept, a semiconductor package stack structure may include a lower semiconductor package, an interposer substrate disposed on the lower semiconductor package and having a horizontal width greater than a horizontal width of the lower semiconductor package, an upper semiconductor package disposed on the interposer substrate, and an underfill portion configured to fill a space between the lower semiconductor package and the interposer substrate and surround side surfaces of the lower semiconductor package.

In an embodiment, the semiconductor package stack structure may include a lower semiconductor package having a lower package substrate, a lower semiconductor chip mounted on the lower package substrate, and a lower molding member formed to surround side surfaces of the lower semiconductor chip on the lower package substrate, an upper semiconductor package having an upper package substrate, an upper semiconductor chip mounted on the upper package substrate, and an upper molding member formed to cover side surfaces and upper surfaces of the upper semiconductor chip on the upper package substrate, an interposer substrate disposed between the lower semiconductor package and the upper semiconductor package and having a horizontal width greater than a horizontal width of the lower semiconductor package, and an underfill portion configured to fill a space between the lower semiconductor package and the interposer substrate and surround side surfaces of the lower semiconductor package.

In accordance with another aspect of the inventive concept, a semiconductor package stack structure may include a lower semiconductor package, an upper semiconductor package disposed on the lower semiconductor package, an interposer substrate disposed between the lower semiconductor package and the upper semiconductor package, and an underfill portion configured to fill a space between the interposer substrate and the lower semiconductor package, and surround side surfaces of the lower semiconductor package. An area of the interposer substrate may be greater than an area of the lower semiconductor package in a top view.

Detailed items of the other embodiments of the inventive concept are included in the detailed descriptions and the accompanying drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. In the drawings.

DETAILED DESCRIPTION OF THE EMBODIMENTS

Figure 1A:
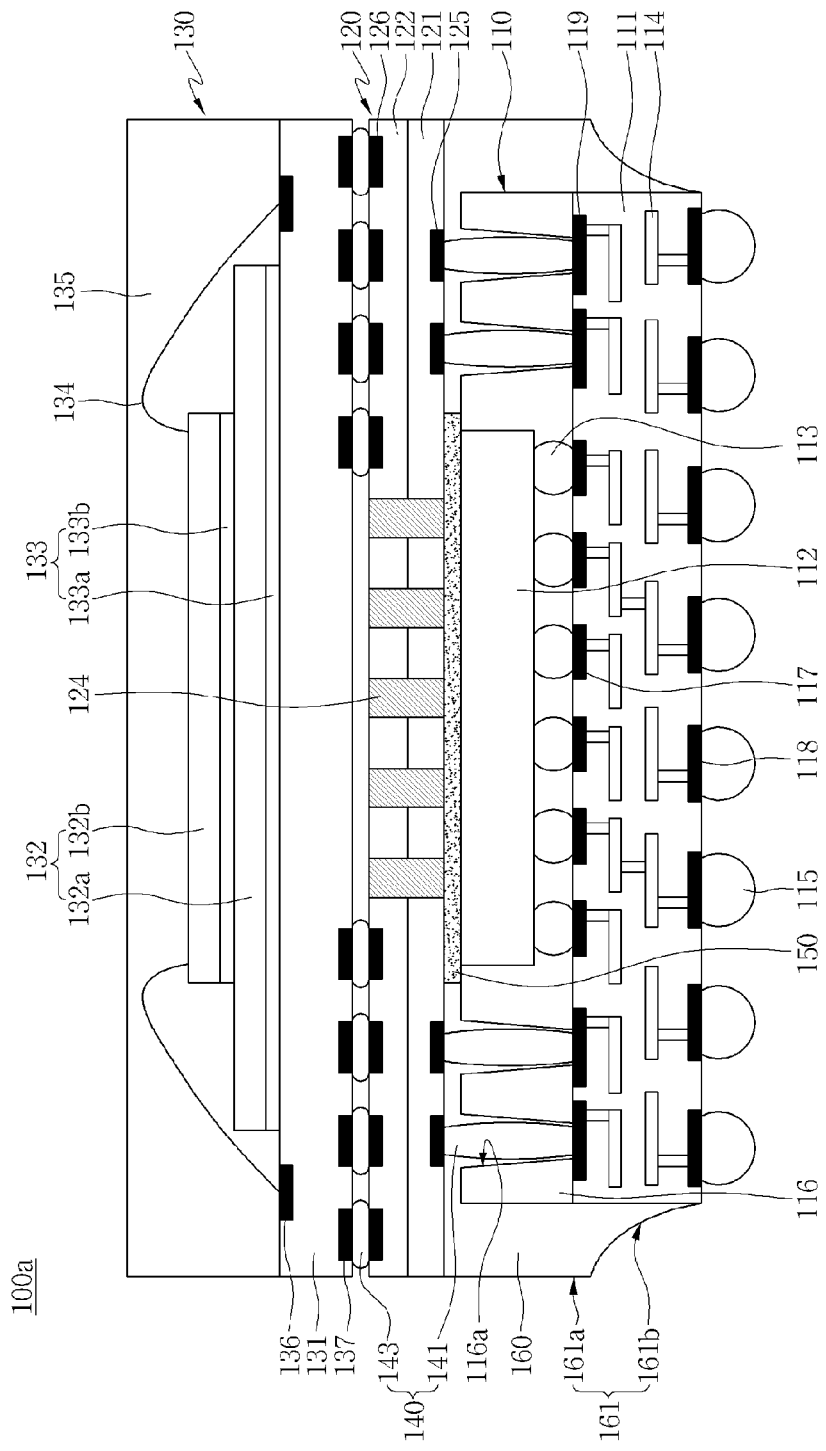
FIG. 1A is a semiconductor package stack structure schematically illustrating a longitudinal cross-sectional view in accordance with an embodiment of the inventive concept.

The inventive concept will now be described more fully with reference to the accompanying drawings to clarify aspects, features, and advantages of the present invention. The invention may, however, be embodied in many different forms and should not be construed as being limited to the embodiments set forth herein. Rather, these embodiments are provided so that this disclosure will be thorough and complete, and will fully convey the concept of the invention to those of ordinary skill in the art. The present invention is defined by the appended claims.

The terminology used herein is for the purpose of describing particular embodiments only and is not intended to be limiting of the inventive concept. As used herein, the singular forms "a", "an," and "the" are intended to include the plural forms as well, unless the context clearly indicates otherwise. It will be further understood that the terms "comprises", "comprising,", "includes," and/or "including", when used herein, specify the presence of stated features, integers, steps, operations, elements, and/or components, but do not preclude the presence or addition of one or more other features, integers, steps, operations, elements, components, and/or groups thereof.

When one element (elements) is (are) "connected" or "coupled" to other element(s), this may indicate directly connected or coupled to the elements(s), or intervening elements may be present. Throughout the entire specification, the same reference numerals refer to the same components. The "and/or" includes each and all combinations of one or more of the items mentioned.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Figure 1B:
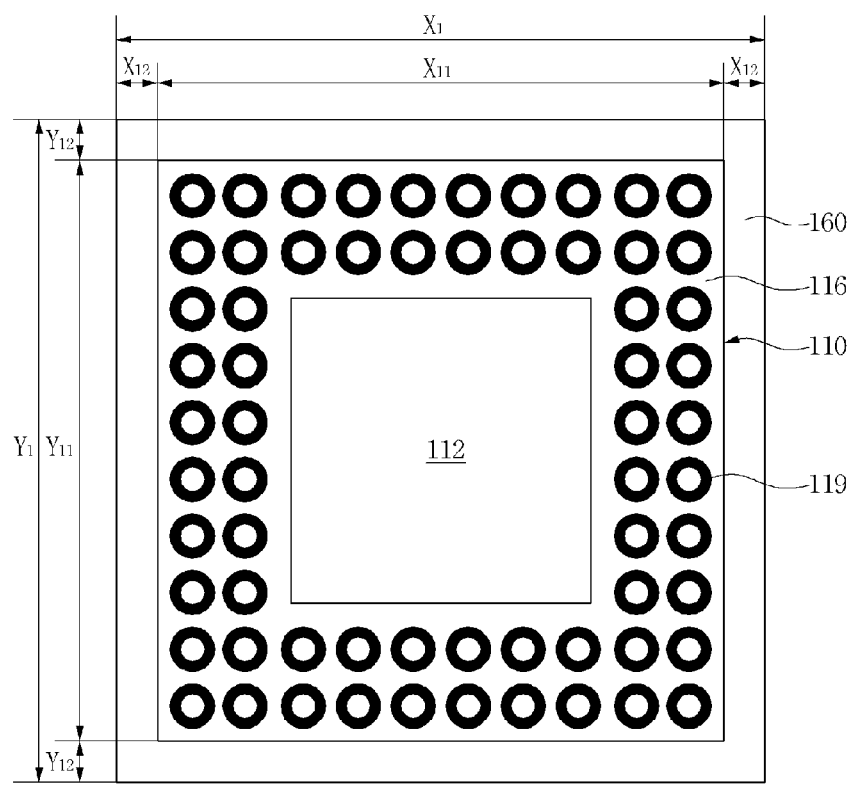
FIGS. 1B and 1C are a top view of the lower semiconductor package and a bottom view of an interposer substrate, respectively, in the semiconductor package stack structure of FIG. 1A.
Figure 1C:
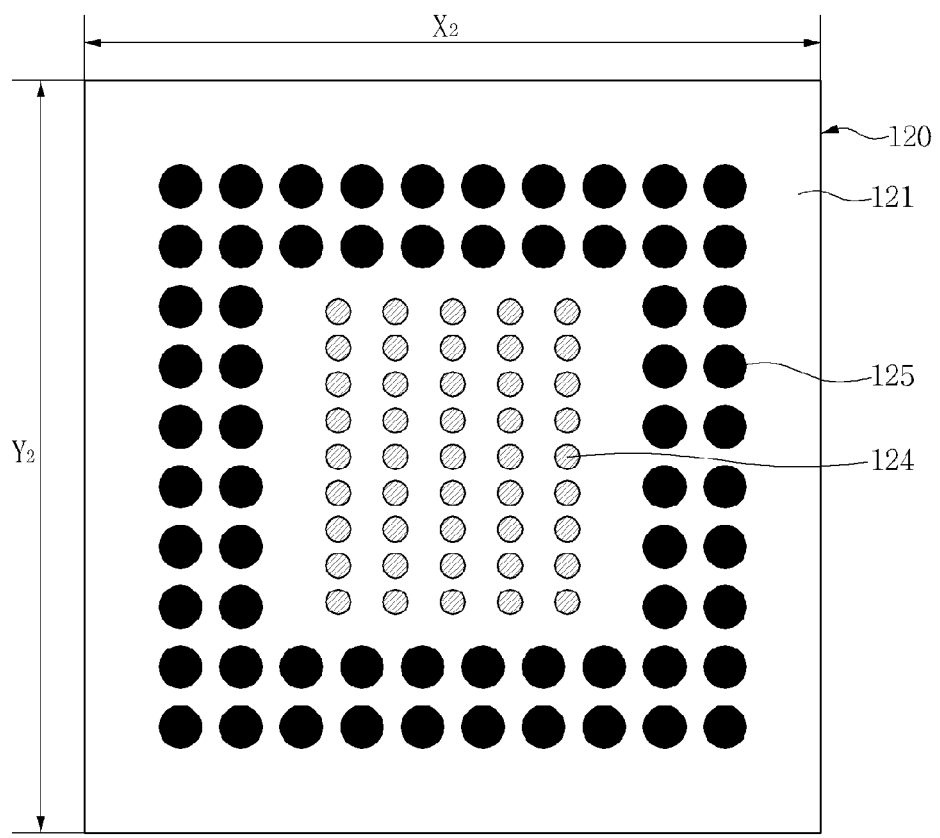

FIG. 1A is a longitudinal cross-sectional view schematically illustrating a semiconductor package stack structure in accordance with an embodiment of the inventive concept, and FIGS. 1B and 1C are a top view of a lower semiconductor package and a bottom view of an interposer substrate respectively in the semiconductor package stack structure of FIG. 1A.

Referring to FIGS. 1A to 1C, a semiconductor package stack structure 100a in accordance with an embodiment of the inventive concept may include a lower semiconductor package 110, an interposer substrate 120, an upper semiconductor package 130, connection bumps 140, a heat transfer layer 150, and underfill portions 160.

The lower semiconductor package 110 may include a lower package substrate 111, a lower semiconductor chip 112, chip bumps 113, external connection terminals 115, and a lower molding member 116.

The lower package substrate 111 may include a rigid printed circuit board, a flexible printed circuit board, and a rigid-flexible printed circuit board. The lower package substrate 111 may include a single-layer printed circuit board and a multi-layer printed circuit board. The lower package substrate 111 may further include chip bump pads 117, external terminal pads 118, upper connection pads 119, and lower interconnections 114.

The chip bump pads 117 may be formed on an upper surface of the lower package substrate 111. The chip bumps 113 may be disposed on the chip bump pads 117.

The external terminal pads 118 may be formed on a lower surface of the lower package substrate 111. The external connection terminals 115 may be disposed on the external terminal pads 118.

The upper connection pads 119 may be formed on the upper surface of the lower package substrate 111. Each of the chip bump pads 117, the external terminal pads 118, and the upper connection pads 119 may include a metal material such as, for example, copper (Cu), nickel (Ni), aluminum (Al), or the like.

The lower interconnections 114 may be formed in the lower package substrate 111. The lower interconnections 114 may electrically connect the chip bump pads 117, the external terminal pads 118, and the upper connection pads 119.

The lower semiconductor chip 112 may include a logic chip. An upper surface of the lower semiconductor chip 112 may be exposed. The lower semiconductor chip 112 may be mounted on the lower package substrate 111 so that a lower surface thereof is facing the upper surface of the lower package substrate 111.

The chip bumps 113 may be formed between the upper surface of the lower package substrate 111 and the lower surface of the lower semiconductor chip 112. The chip bumps 113 may electrically connect the lower package substrate 111 to the lower semiconductor chip 112.

The chip bumps 113 may include, for example, a solder ball or a copper pillar. The lower semiconductor chip 112 may be mounted on the upper surface of the lower package substrate 111 using the chip bumps 113 by a flip-chip bonding method.

The external connection terminals 115 may be formed on the lower surface of the lower package substrate 111. The external connection terminals 115 may include a solder ball, a conductive bump, a pin grid array, a lead grid array, a copper pillar, or a combination thereof. The external connection terminals 115 may be electrically connected to the lower interconnections 114.

The lower molding member 116 may be formed on the lower package substrate 111 to surround side surfaces of the lower semiconductor chip 112. The lower molding member 116 may fill in between the lower surface of the lower semiconductor chip 112 and the upper surface of the lower package substrate 111. The lower molding member 116 may include an epoxy molding compound (EMC). The upper surface of the lower semiconductor chip 112 and an upper surface of the lower molding member 116 may be substantially coplanar. Side surfaces of the lower molding member 116 and side surfaces of the lower package substrate 111 may be vertically aligned. That is, a horizontal width of the lower molding member 116 and a horizontal width of the lower package substrate 111 may be substantially the same.

The interposer substrate 120 may include a lower insulating layer 121, an upper insulating layer 122, and thermal vias 124. In an embodiment, the interposer substrate 120 may further include first connection pads 125 and second connection pads 126.

Each of the lower insulating layer 121 and the upper insulating layer 122 may include an insulating material such as, for example, an epoxy resin, a polyimide, a plastic, a ceramic, an organic polymer, or the like. An upper surface of the lower insulating layer 121 may directly contact a lower surface of the upper insulating layer 122 according to an embodiment. That is, the interposer substrate 120 may have a structure of the lower insulating layer 121 bonded to the upper insulating layer 122. A lower surface of the lower insulating layer 121 and an upper surface of the upper insulating layer 122 may be exposed.

The thermal vias 124 may be formed to pass through the lower insulating layer 121 and the upper insulating layer 122. The thermal vias 124 may include copper (Cu), gold (Au), aluminum (Al), nickel (Ni), a stainless steel, or an alloy thereof with an excellent thermal conductivity. The thermal vias 124 may be disposed into a shape of an island spaced apart from each other in a horizontal direction.

The first connection pads 125 may be formed on the lower surface of the lower insulating layer 121 at respective locations corresponding to the upper connection pads 119 formed on the upper surface of the lower package substrate 111. The second connection pads 126 may be formed on the upper surface of the upper insulating layer 122 at respective locations corresponding to lower connection pads 137 formed under a lower surface of an upper package substrate 131 of the upper semiconductor package 130. Each of the first connection pads 125 and the second connection pads 126 may include a metal material such as copper (Cu), nickel (Ni), aluminum (Al), or the like. The first connection pads 125 and the second connection pads 126 may be electrically connected.

The upper semiconductor package 130 may include an upper package substrate 131, upper semiconductor chips 132, adhesive layers 133, wires 134, and an upper molding member 135.

The upper package substrate 131 may include a rigid printed circuit board, a flexible printed circuit board, and a rigid-flexible printed circuit board. The upper package substrate 131 may include a single-layer printed circuit board and a multi-layer printed circuit board. The upper package substrate 131 may further include bonding pads 136 and the lower connection pads 137.

The bonding pads 136 may be disposed on an upper surface of the upper package substrate 131. The lower connection pads 137 may be disposed under a lower surface of the upper package substrate 131. The lower connection pads 137 may be disposed under the lower surface of the upper package substrate 131 at respective locations corresponding to the second connection pads 126 disposed on an upper surface of the interposer substrate 120. Each of the bonding pads 136 and the lower connection pads 137 may include a metal material such as copper (Cu), nickel (Ni), aluminum (Al), or the like. The bonding pads 136 and the lower connection pads 137 may be electrically connected.

The upper semiconductor chips 132 may include a memory chip such as a DRAM or a flash memory. The upper semiconductor chips 132 may include a first upper semiconductor chip 132a stacked on the upper surface of the upper package substrate 131 and a second upper semiconductor chip 132b stacked on the first upper semiconductor chip 132a. Although FIG. 1A illustrates the upper semiconductor chips 132 including two upper semiconductor chips 132a and 132b, one or three or more upper semiconductor chips may be included in the upper semiconductor chips 132. A horizontal width of the upper semiconductor chips 132 may be greater than that of the lower semiconductor chip 112.

The adhesive layers 133 may be formed between the upper semiconductor chips 132. For example, the adhesive layers 133 may include a first adhesive layer 133a formed between the upper surface of the upper package substrate 131 and a lower surface of the first upper semiconductor chip 132a, and a second adhesive layer 133b formed between an upper surface of the first upper semiconductor chip 132a and a lower surface of the second upper semiconductor chip 132b. The adhesive layers 133 may include a nonconductive adhesive material such as an epoxy resin.

The wires 134 may electrically connect the upper semiconductor chips 132 to the upper package substrate 131. The wires 134 may include a metal material such as copper (Cu), nickel (Ni), aluminum (Al), gold (Au), or the like. In an embodiment, wire bonding pads for bonding the wires 134 may be formed on an upper surface of the upper semiconductor chips 132. The wires 134 may be bonded to the bonding pads 136.

The upper molding member 135 may be formed on the upper package substrate 131 to surround upper surfaces and side surfaces of the upper semiconductor chips 132. The upper molding member 135 may include an epoxy molding compound (EMC). Side surfaces of the upper molding member 135 and side surfaces of the upper package substrate 131 may be vertically aligned. That is, a horizontal width of the upper molding member 135 and a horizontal width of the upper package substrate 131 may be substantially the same.

The connection bumps 140 may include lower connection bumps 141 and upper connection bumps 143.

The lower connection bumps 141 may physically and/or electrically connect the lower semiconductor package 110 to the interposer substrate 120. The lower connection bumps 141 may be formed in holes 116a which is formed in the lower molding member 116, respectively. For example, the lower connection bumps 141 may be formed in the holes 116a, upper portions of the lower connection bumps 141 may contact first connection pads 125 of the interposer substrate 120, and lower portions of the lower connection bumps 141 may contact upper connection pads 119 of the lower package substrate 111, respectively. A vertical length of each lower connection bump 141 may be longer than a vertical length of each hole 116a. That is, upper ends of the lower connection bumps 141 may protrude upward from the upper surface of the lower molding member 116.

The upper connection bumps 143 may physically and/or electrically connect the upper semiconductor package 130 to the interposer substrate 120. For example, the upper connection bumps 143 may be formed between the lower connection pads 137 formed under the lower surface of the upper package substrate 131 and the second connection pads 126 formed on upper surface of the interposer substrate 120. In an embodiment, upper surfaces of the upper connection bumps 143 may contact the lower connection pads 137 of the upper package substrate 131 and lower surfaces of the upper connection bumps 143 may contact the second connection pads 126 of the interposer substrate 120, respectively. Each of the lower connection bumps 141 and the upper connection bumps 143 may include a solder ball.

The heat transfer layer 150 may be formed between a lower surface of the interposer substrate 120 and an upper surface of the lower semiconductor package 110. In an embodiment, the heat transfer layer 150 may be formed under the lower surface of the interposer substrate 120 and between the thermal vias 124 and the upper surface of the lower semiconductor chip 112. As illustrated in FIG. 1A, the heat transfer layer 150 may extend to adjacent the side surfaces of the lower semiconductor chip 112 on the upper surface of the lower molding member 116. Accordingly, an area of the heat transfer layer 150 may be larger than an area of the lower semiconductor chip 112 in a top view.

The heat transfer layer 150 may include a thermal interface material (TIM) having an excellent heat transfer characteristic. The heat transfer layer 150 may be formed by curing the TIM from a liquid or paste form. The TIM may include a thermally conductive adhesive, a thermally conductive compound, or a thermally conductive gel. In an embodiment, the TIM may include a thermally conductive filler such as a metal particle. The heat transfer layer 150 may contact the upper surface of the lower semiconductor chip 112 and the thermal vias 124, and effectively transfer heat generated from the lower semiconductor chip 112 to the thermal vias 124.

The underfill portions 160 may fill in between the lower surface of the interposer substrate 120 and the lower semiconductor package 110, and may be formed to cover side surfaces of the lower semiconductor package 110. The underfill portions 160 may include an insulating material such as an epoxy resin. Side surfaces 161 of the underfill portions 160 may include first side surfaces 161a and second side surfaces 161b. The first side surfaces 161a and second side surfaces 161b of the underfill portions 160 may be formed at locations corresponding to upper side surfaces and lower side surfaces of the lower semiconductor package 110, respectively. The upper side surfaces and the lower side surfaces of the lower semiconductor package 110 may correspond to side surfaces of lower molding member 116 and side surfaces of lower package substrate 111, respectively.

For example, the first side surfaces 161a of the underfill portions 160 may be vertically aligned with side surfaces of the interposer substrate 120. In an embodiment, the second side surfaces 161b of the underfill portions 160 may be formed to have a slope from the side surfaces of the interposer substrate 120 instead of maintaining a vertical alignment. In an embodiment, the second side surfaces 161b of the underfill portions 160 have a shape, in which a distance between the second side surfaces 161b of the underfill portions 160 and the lower semiconductor package 110 becomes small in a direction toward a lower end of the lower semiconductor package 110 from a connected portion of the first side surfaces 161a, which may be curved inward. The second side surfaces 161b of the underfill portions 160 may have a concave shape in a direction of the lower semiconductor package 110 as illustrated in FIG. 1. The underfill portions 160 may cover side surfaces of upper end portions of the lower connection bumps 141, which protrude from the upper surface of the lower molding member 116, and side surfaces of the heat transfer layer 150.

In the semiconductor package stack structure 100a in accordance with an embodiment of the inventive concept, a horizontal width of the upper semiconductor package 130 may be substantially the same as a horizontal width of the interposer substrate 120, and be greater than a horizontal width of the lower semiconductor package 110.

In the semiconductor package stack structure in accordance with an embodiment of the inventive concept, the horizontal width of the interposer substrate 120 may be greater than the horizontal width of the lower semiconductor package 110 as illustrated in FIG. 1A. Referring to FIGS. 1B and 1C, a horizontal length $X_{11}$ of the lower semiconductor package 110 may be smaller than a horizontal length $X_2$ of the interposer substrate 120, and a vertical length $Y_{11}$ of the lower semiconductor package 110 may further be smaller than a vertical length $Y_2$ of the interposer substrate 120 in a top view. Accordingly, an area of the interposer substrate 120 may be greater than an area of the lower semiconductor package 110 in a top view.

A total horizontal length $X_1$ combining the horizontal length $X_{11}$ of the lower semiconductor package 110 and lengths $X_{12}$ from vertical surfaces of the lower semiconductor package 110 to vertical surfaces of underfill portions 160 may be the same as the horizontal length $X_2$ of the interposer substrate 120, and a total vertical length $Y_1$ combining the vertical length $Y_{11}$ of the lower semiconductor package 110 and vertical lengths $Y_{12}$ from horizontal surfaces of the lower semiconductor package 110 to horizontal surfaces of underfill portions 160 may be the same as the vertical length $Y_2$ of the interposer substrate 120. That is, side surfaces of the interposer substrate 120 may vertically align with side surfaces of the underfill portions 160, respectively.

The foregoing is descriptions of the semiconductor package stack structure 100a in accordance with the embodiment of the inventive concept. The semiconductor package stack structure 100a in accordance with the embodiment of the inventive concept can reduce a size of the lower semiconductor package.

Furthermore, in the semiconductor package stack structure 100a in accordance with the embodiment of the inventive concept, since an interposer substrate having substantially the same size as an upper semiconductor package may be disposed between a lower and upper semiconductor packages which have a different size, the lower and the upper semiconductor packages of the different sizes may be easily bonded.

A lower semiconductor package may comprise a logic chip and an upper semiconductor package may comprise a memory chip according to an embodiment.

When the lower and the upper semiconductor packages have different sizes, a poor interfacial bonding between the lower and the upper semiconductor packages may occur because the lower semiconductor package may not be fixed when stacking the upper semiconductor package on the lower semiconductor package. To resolve such a problem, an interposer substrate having substantially the same size of the upper semiconductor package is disposed between the lower and the upper semiconductor packages in an embodiment of the inventive concept. Accordingly, the size of the lower semiconductor package can be reduced, and the lower and the upper semiconductor packages having different sizes may be easily bonded at the same time.

FIGS. 2A to 3B are longitudinal cross-sectional views conceptually illustrating semiconductor package stack structures in accordance with various embodiments of the inventive concept.

Figure 2A:
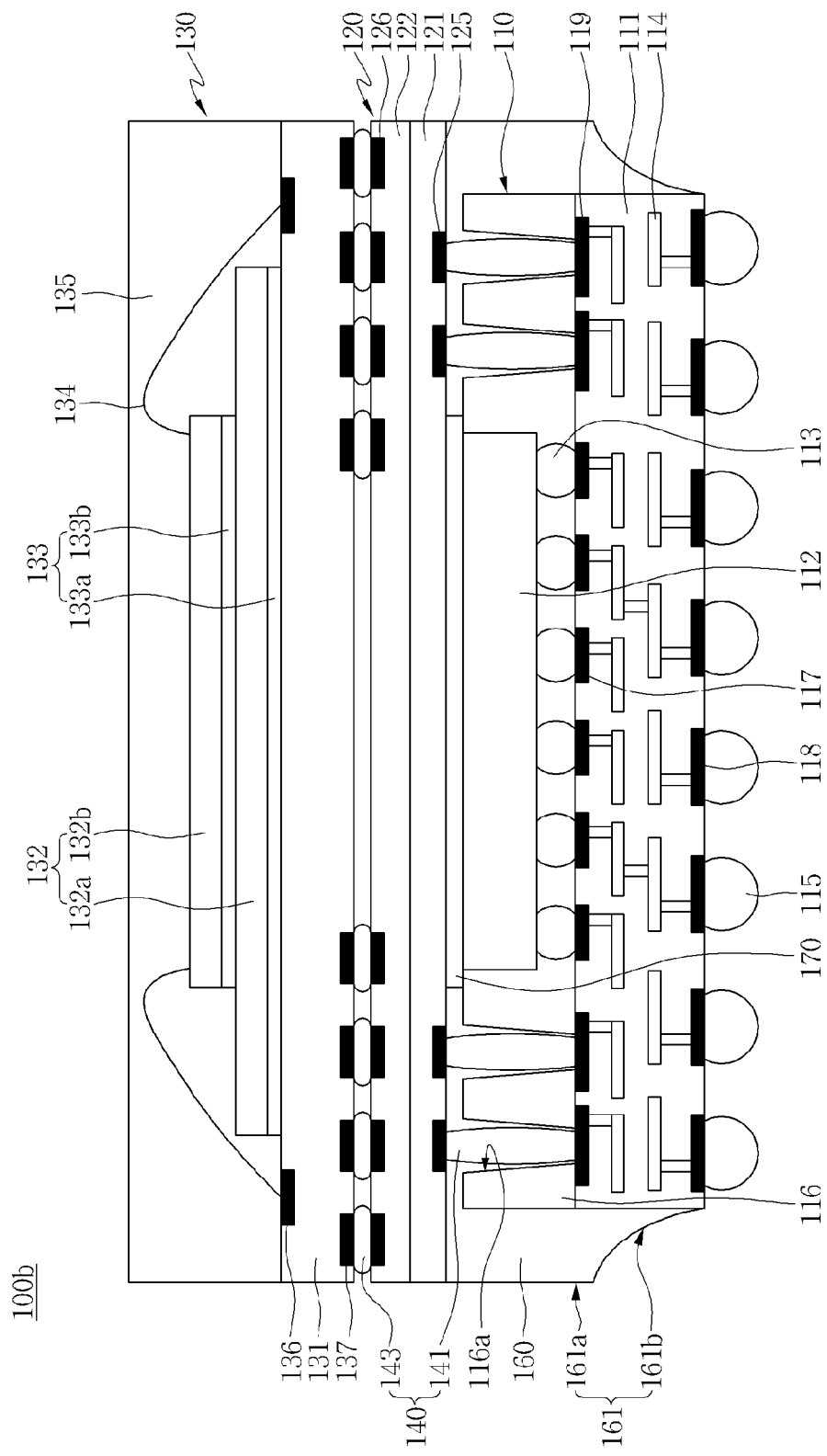
FIGS. 2A to 3B are semiconductor package stack structures schematically illustrating longitudinal cross-sectional views in accordance with various embodiments of the inventive concept.

Referring to FIG. 2A, a semiconductor package stack structure 100b in accordance with the embodiment of the inventive concept, in comparison with the semiconductor package stack structure 100a of FIG. 1A, may not include the thermal vias 124 of the interposer substrate 120 and the heat transfer layer 150 between a lower surface of the interposer substrate 120 and the lower semiconductor package 110, and may include an adhesive material layer 170 having an epoxy.

Figure 2B:
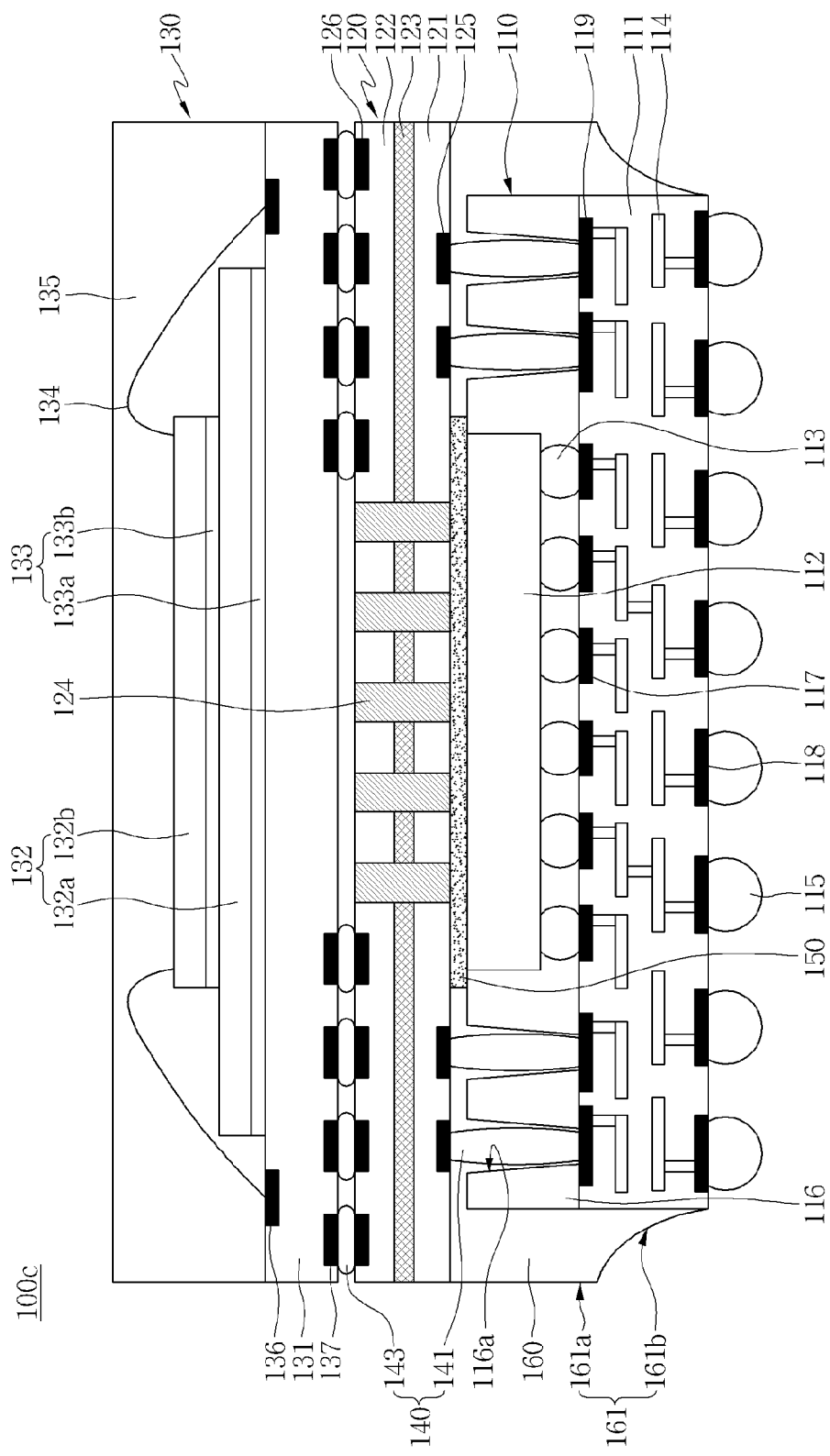

Referring to FIG. 2B, a semiconductor package stack structure 100c in accordance with the embodiment of the inventive concept, in comparison with the semiconductor package stack structure 100a of FIG. 1A, may include the interposer substrate 120 having a core layer 123 between the lower insulating layer 121 and the upper insulating layer 122. The core layer 123 may include a stiffener such as fiberglass, filler, or the like.

Figure 2C:
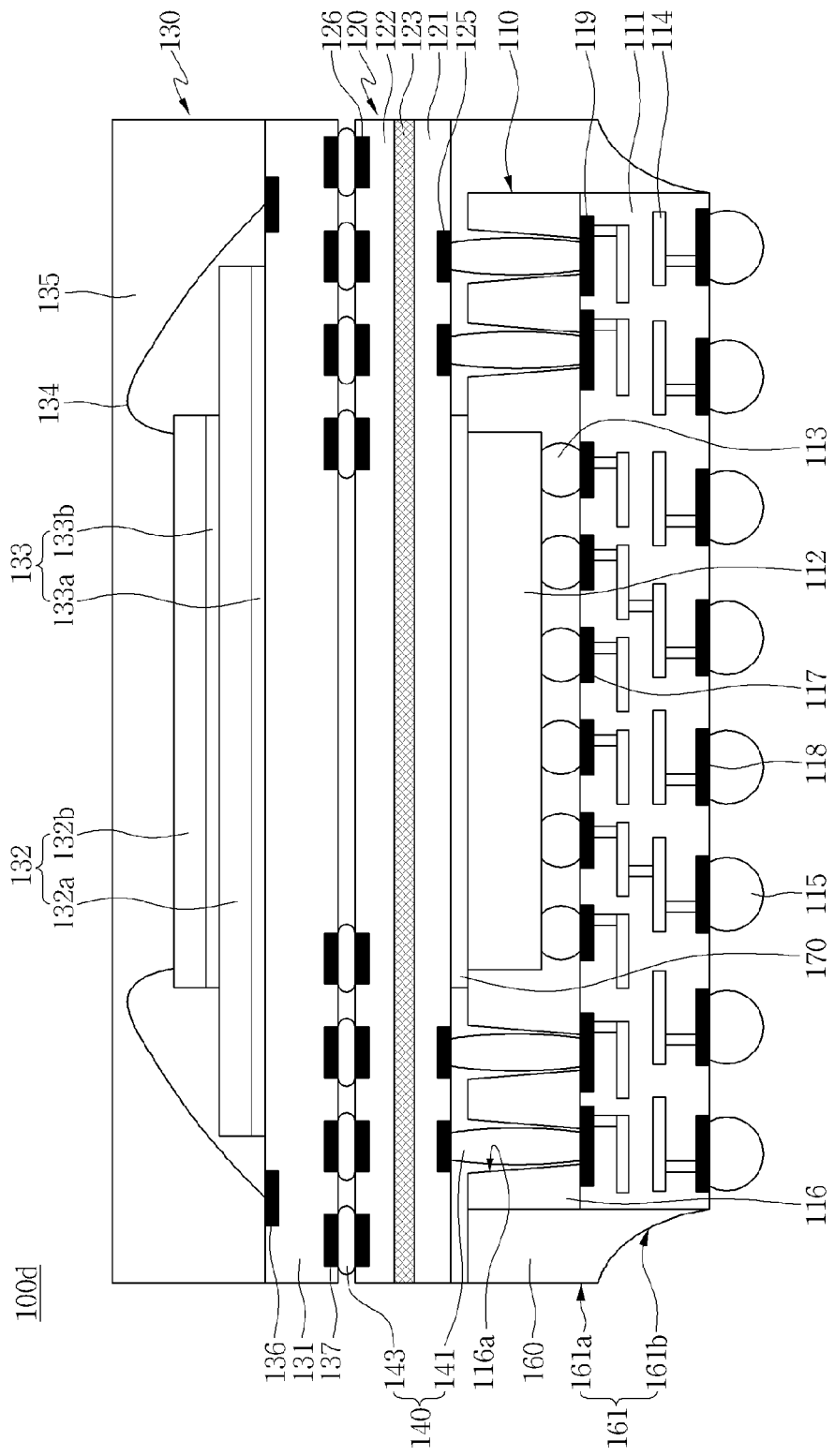

Referring to FIG. 2C, a semiconductor package stack structure 100d in accordance with the embodiment of the inventive concept, in comparison with the semiconductor package stack structure 100a of FIG. 1A, may include the interposer substrate 120 having a core layer 123 between the lower insulating layer 121 and the upper insulating layer 122, and may not include the thermal vias 124 passing through the interposer substrate 120. Further, referring to the semiconductor package stack structure 100b of FIG. 2B, the heat transfer layer 150 may not be formed between a lower surface of the interposer substrate 120 and an upper surface of the lower semiconductor package 110, and an adhesive material layer 170 having an epoxy may be formed.

Figure 2D:
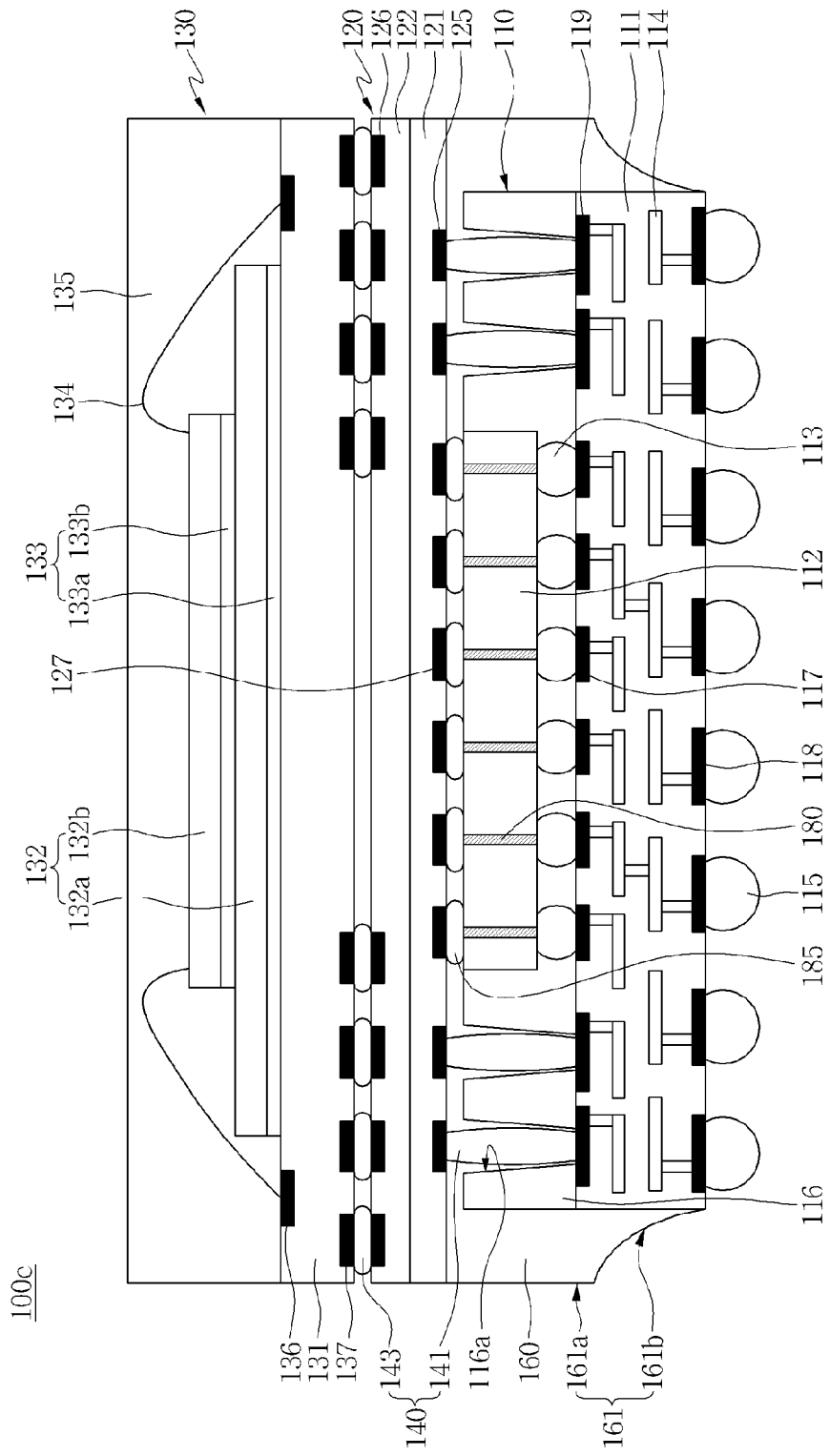

Referring to FIG. 2D, a semiconductor package stack structure 100e in accordance with the embodiment of the inventive concept, in comparison with the semiconductor package stack structure 100a FIG. 1A, may include through silicon vias (TSVs) 180 vertically passing through the lower semiconductor chip 112. Further, the lower semiconductor chip 112 may further include internal terminals 185 disposed on an upper surface of the lower semiconductor chip 112. The internal terminals 185 may electrically connect the lower semiconductor chip 112 to the interposer substrate 120. The TSVs 180 may electrically connect the chip bumps 113 to the internal terminals 185. Further, the thermal vias 124 may not be formed in the interposer substrate 120. Further, the heat transfer layer 150 may not be formed between a lower surface of the interposer substrate 120 and the lower package substrate 111. Further, side surfaces of the internal terminals 185 may be covered with the underfill portions 160.

Figure 2E:
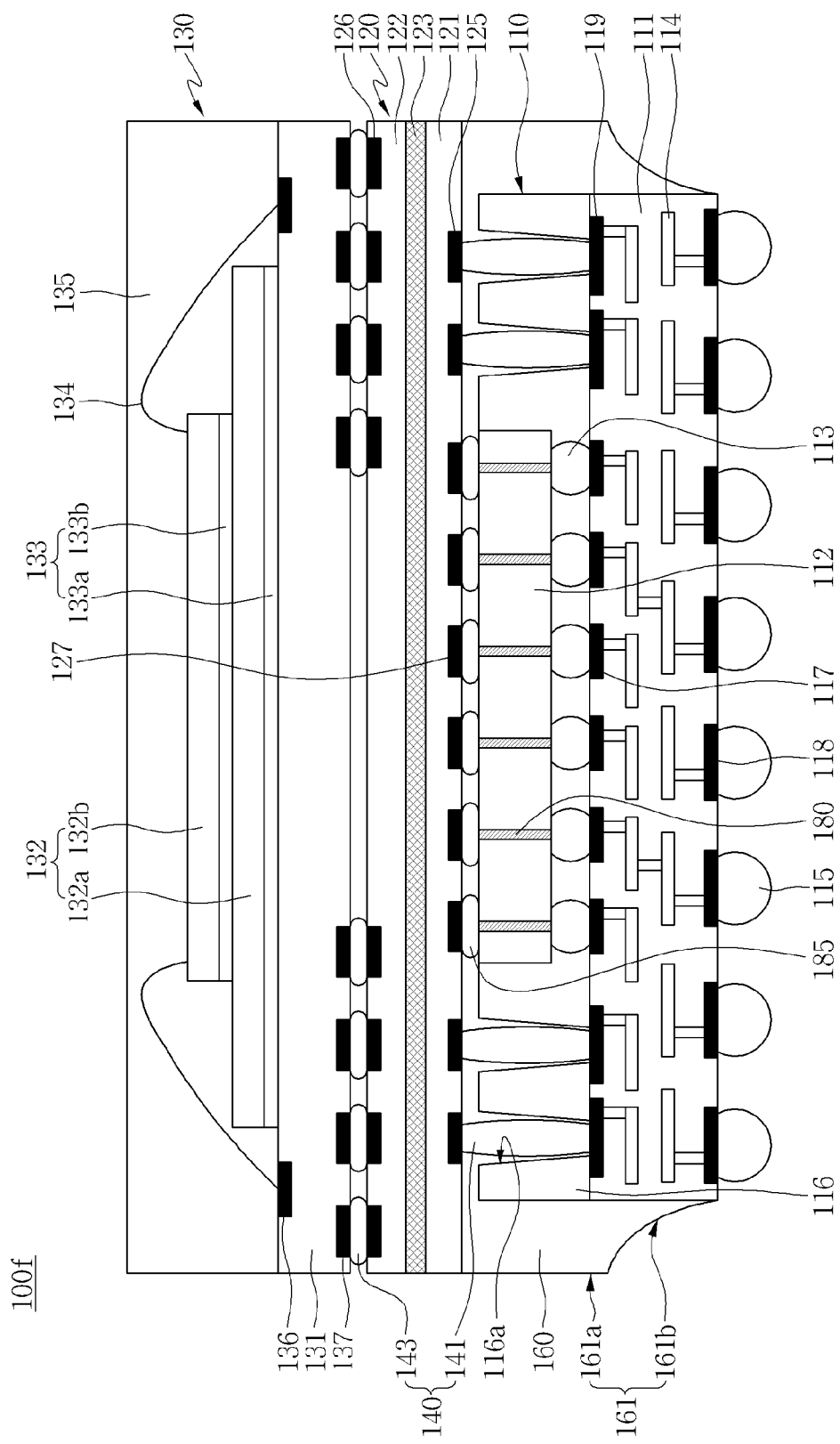

Referring to FIG. 2E, a semiconductor package stack structure 100f in accordance with the embodiment of the inventive concept, in comparison with the semiconductor package stack structure 100a of FIG. 1A, may include TSVs 180 vertically passing through the lower semiconductor chip 112. Further, the lower semiconductor chip 112 may further include internal terminals 185 formed on an upper surface of the lower semiconductor chip 112. The internal terminals 185 may electrically connect the lower semiconductor chip 112 to the interposer substrate 120. The TSVs 180 may electrically connect the chip bumps 113 to the internal terminals 185. Further, the interposer substrate 120 may include a core layer 123 between the lower insulating layer 121 and the upper insulating layer 122. Further, side surfaces of the internal terminals 185 may be covered with the underfill portions 160.

Figure 3A:
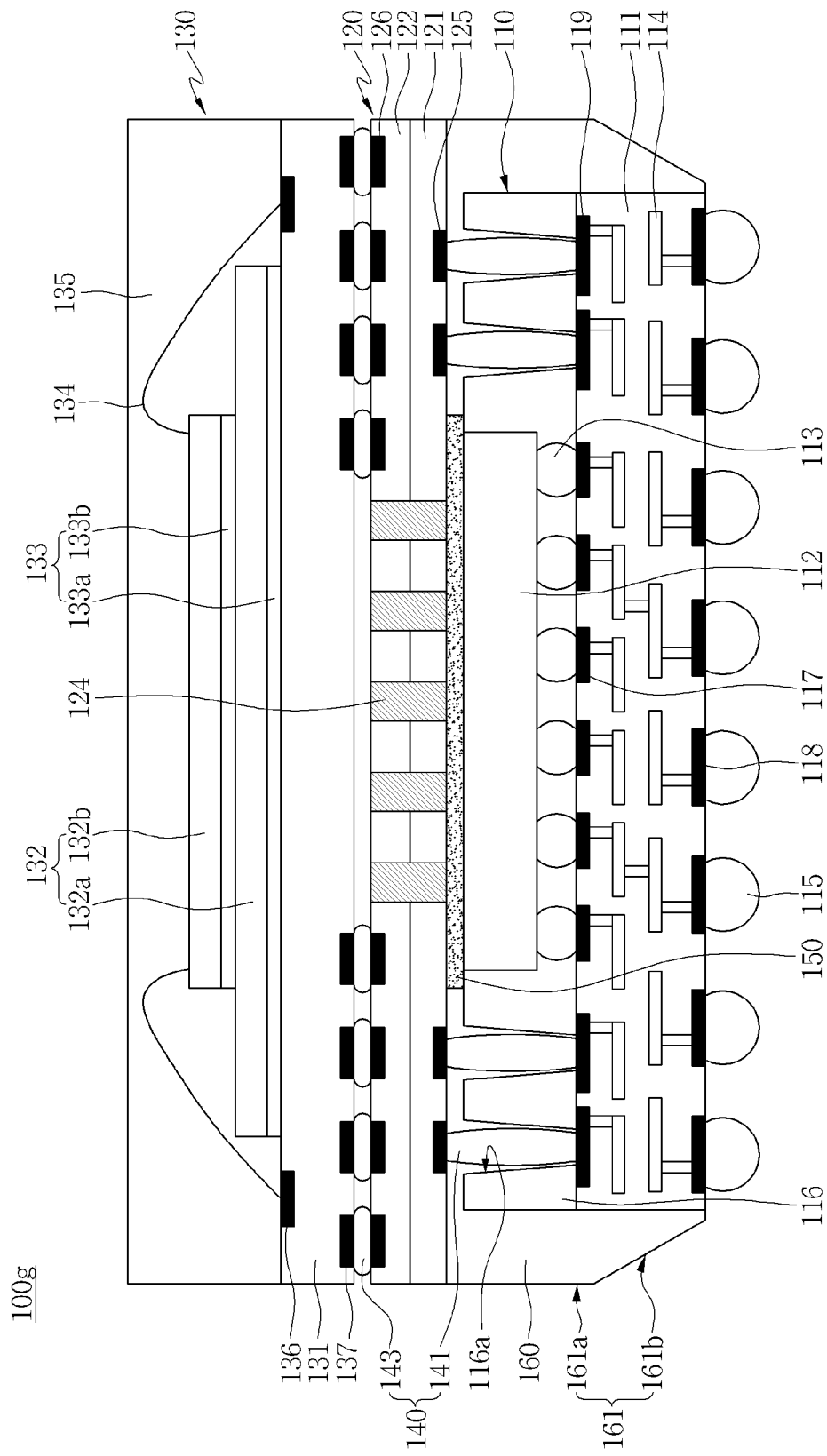

Referring to FIG. 3A, a semiconductor package stack structure 100g in accordance with the embodiment of the inventive concept may include the second side surfaces 161b having a more linear shape compared to the semiconductor package stack structure 100a of FIG. 1A.

Figure 3B:
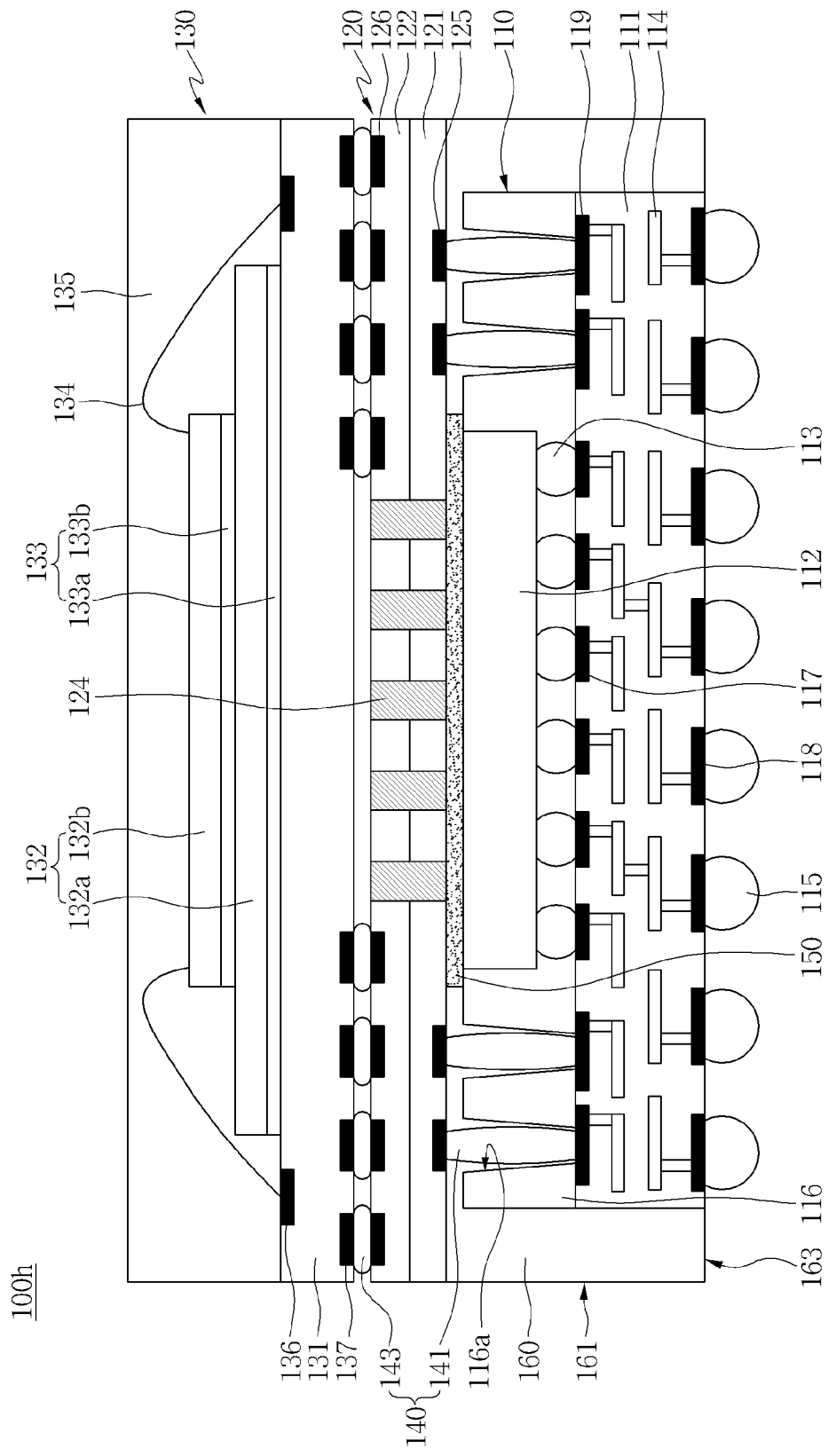

Referring to FIG. 3B, a semiconductor package stack structure 100h in accordance with the embodiment of the inventive concept, in comparison with the semiconductor package stack structure 100a of FIG. 1A, may have the underfill portions 160 including side surfaces 161 and lower surfaces 163, have the side surfaces 161 substantially and vertically aligned with side surfaces of the interposer substrate 120 and side surfaces of the upper semiconductor package 130, and include the lower surfaces 163 of the underfill portions 160 being substantially co-planar with a lower surface of the lower package substrate 111.

FIGS. 4A to 4G are views illustrating a method of fabricating the semiconductor package stack structure in accordance with the embodiment of the inventive concept.

Figure 4A:
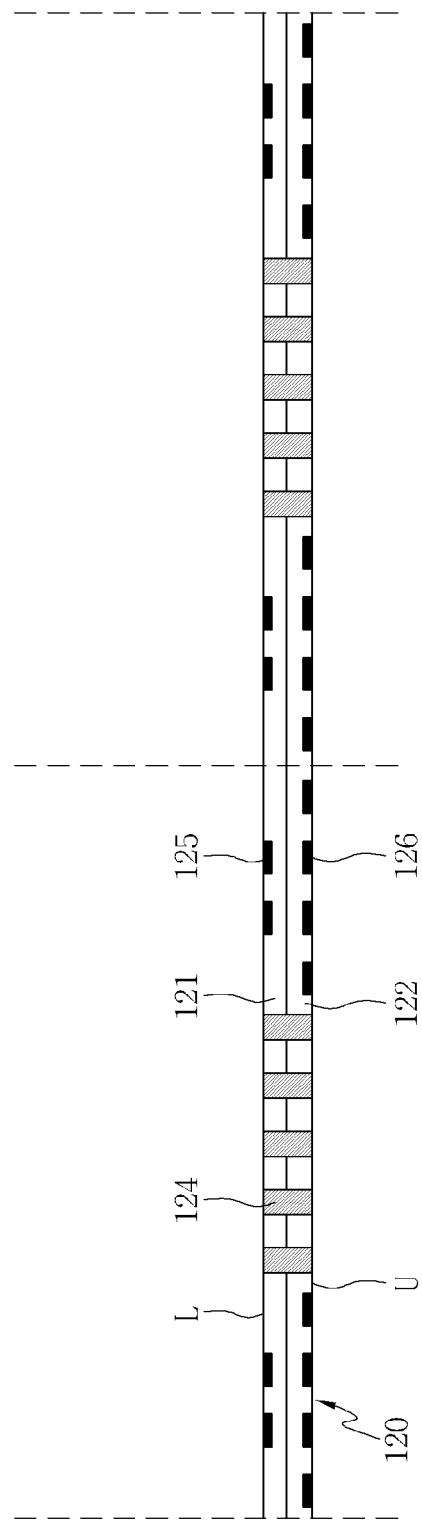
FIGS. 4A to 4G are views illustrating a method of fabricating the semiconductor package stack structure in accordance with the embodiment of the inventive concept.

Referring to FIG. 4A, the method of fabricating the semiconductor package stack structure in accordance with the embodiment of the inventive concept may include forming an interposer substrate 120 having first connection pads 125, second connection pads 126 and thermal vias 124. The forming of the interposer substrate 120 may include preparing a lower insulating layer 121 and an upper insulating layer 122 in contact with an upper surface of the lower insulating layer 121, forming the first connection pads 125 and the second connection pads 126 on a lower surface of the lower insulating layer 121 and under an upper surface of the upper insulating layer 122 respectively, forming via holes passing through the lower insulating layer 121 and the upper insulating layer 122, and forming the thermal vias 124 in the via holes. The first connection pads 125, the second connection pads 126 and the thermal vias 124 may be formed using, for example, a screen printing process, a deposition process, or a plating process. After forming the interposer substrate 120 by performing the above-described process, in the embodiment of the inventive concept, the interposer substrate 120 may be disposed so that an upper surface (U) of the upper insulating layer 122 is facing down, and a lower surface (L) of the lower insulating layer 121 is faced up for a subsequent process. That is, a lower surface (L) of the interposer substrate 120 bonding to a lower semiconductor package 110 is disposed facing upward.

Figure 4B:
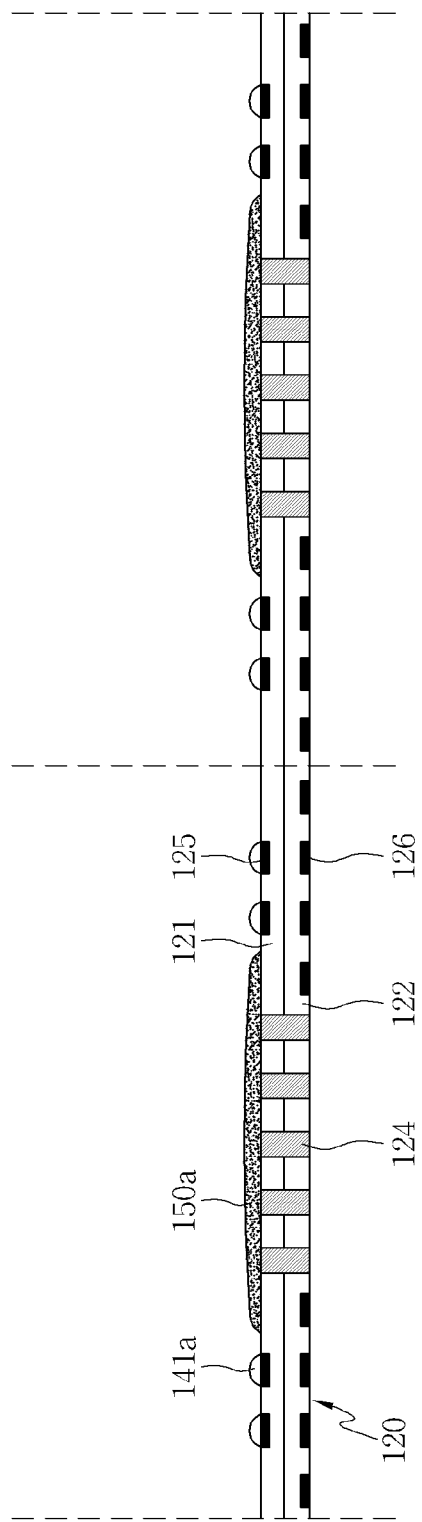

Referring to FIG. 4B, the method of fabricating the semiconductor package stack structure in accordance with the embodiment of the inventive concept may include coating a TIM layer 150a on the thermal vias 124 of the lower surface (L) of the lower insulating layer 121 of the interposer substrate 120, and forming first solder balls 141a on the first connection pads 125. The TIM layer 150a may be coated to cover the thermal vias 124 by a dispenser or the like. The first solder balls 141a may be formed using a screen printing process, an inkjet process, or a soldering process. The first solder balls 141a may be electrically connected to the first connection pads 125. In an embodiment, spraying a flux on the first solder balls 141a may be further included.

Figure 4C:
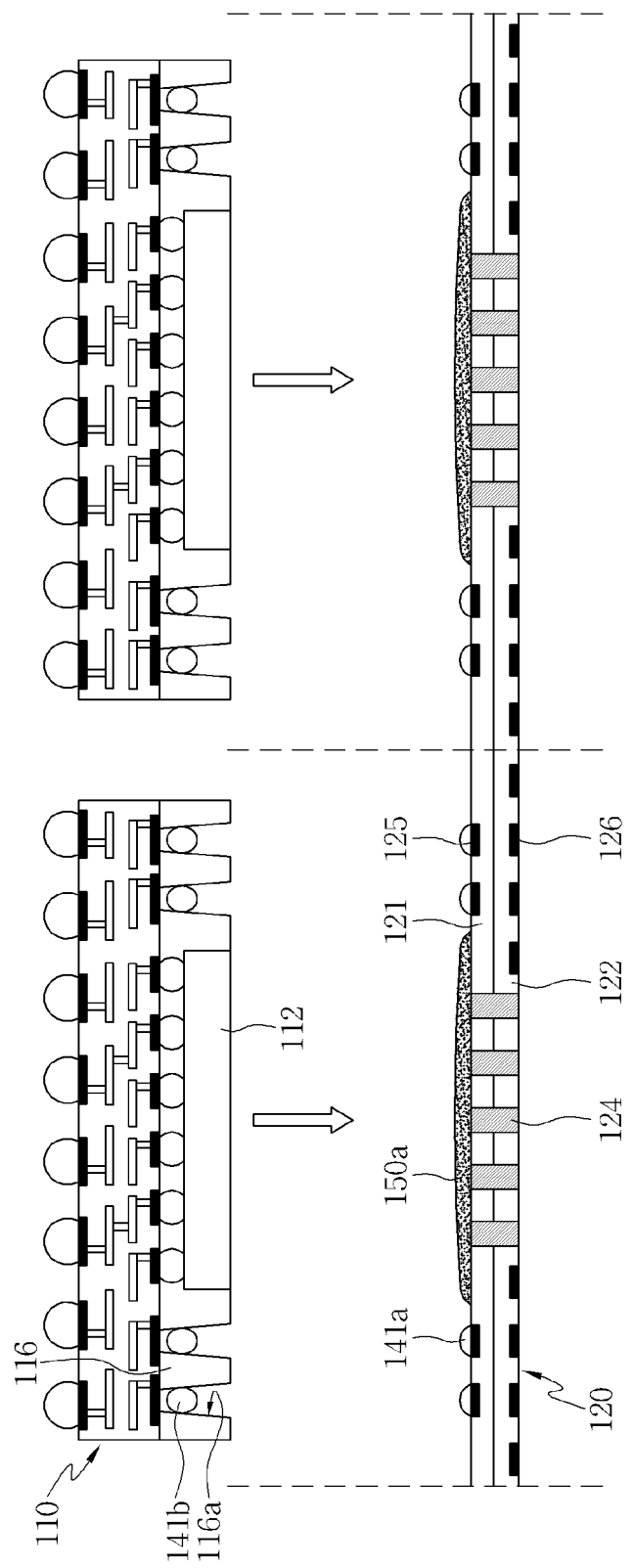

Referring to FIG. 4C, the method of fabricating the semiconductor package stack structure in accordance with the embodiment of the inventive concept may include disposing lower semiconductor packages 110 on the top of the lower surface (L) of the lower insulating layer 121 of the interposer substrate 120. In an embodiment, lower semiconductor packages 110 may be disposed so that each of an upper surface of a lower semiconductor chip 112 and an upper surface of a lower molding member 116 is facing down. Further, second solder balls 141b may be disposed in holes 116a of the lower molding member 116 in each of the lower semiconductor packages 110, respectively. For example, the second solder balls 141b may contact upper connection pads 119 exposed by the holes 116a, respectively. Each of the lower semiconductor packages 110 may be disposed on an upper portion of the interposer substrate 120 so that the holes 116a vertically aligned with the first solder balls 141a on the interposer substrate 120. Then, each of the lower semiconductor packages 110 may be stacked on the interposer substrate 120 in an arrow direction.

Figure 4D:
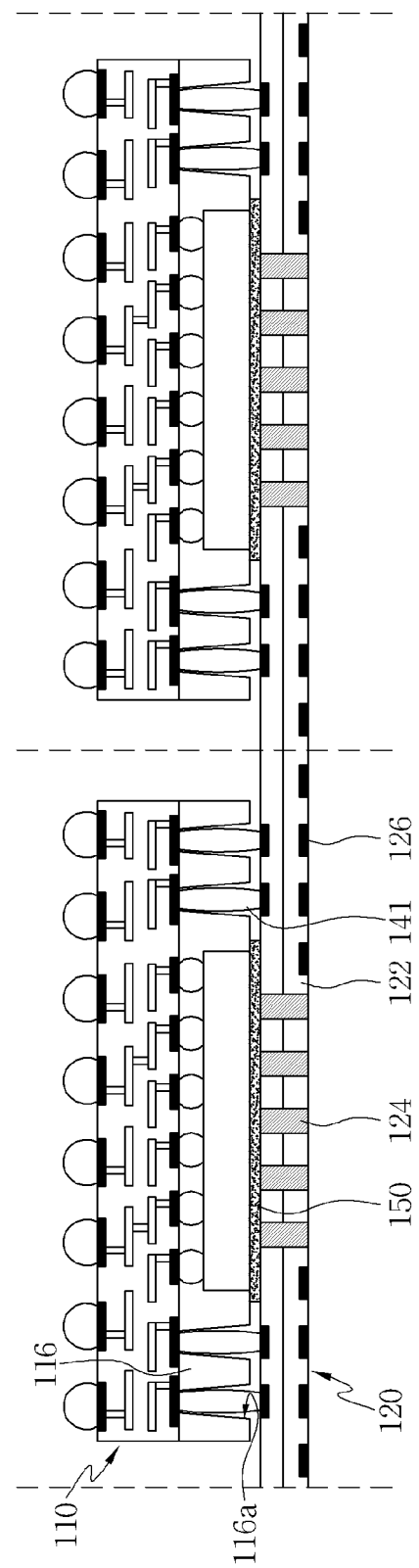

Referring to FIG. 4D, a method of fabricating the semiconductor package stack structure in accordance with the embodiment of the inventive concept may include bonding the lower semiconductor packages 110 on the interposer substrate 120 by performing a reflow process. In an embodiment, the first solder balls 141a formed on the first connection pads 125 of the interposer substrate 120 and the second solder balls 141b formed in the holes 116a of the lower semiconductor packages 110 may melt and form lower connection bumps 141. According to an embodiment, a heat transfer layer 150 may be formed by curing the TIM layer 150a located between an upper surface of lower semiconductor chips 112 and the interposer substrate 120.

Figure 4E:
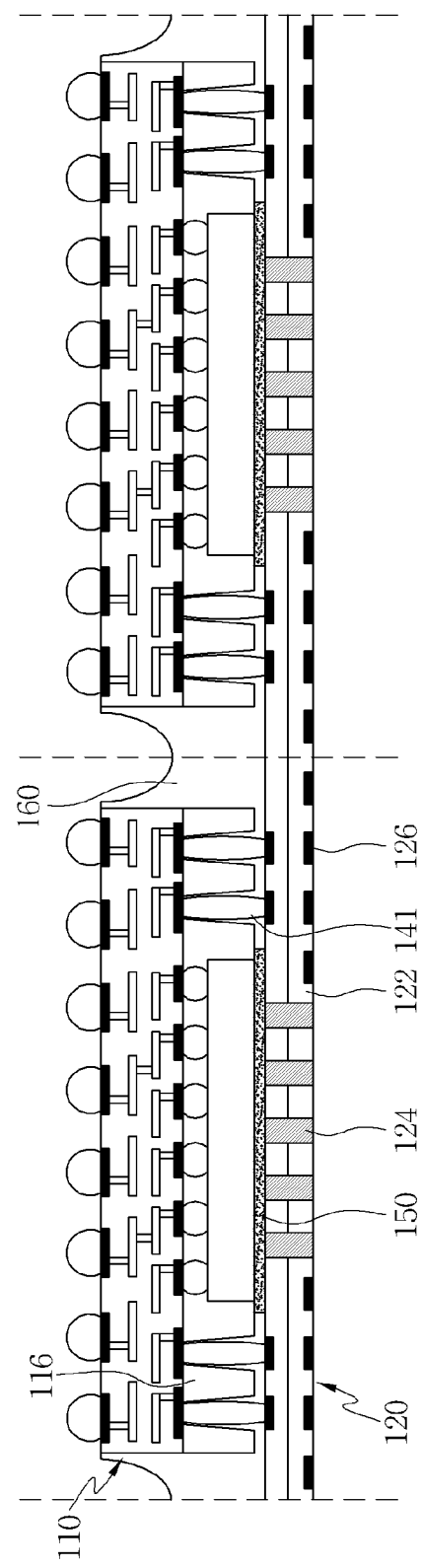

Referring to FIG. 4E, the method of fabricating the semiconductor package stack structure in accordance with the embodiment of the inventive concept may include forming underfill portions 160 which fill in spaces between the lower semiconductor packages 110 and gaps between the lower semiconductor packages 110 and the interposer substrate 120. The forming of the underfill portions 160 may include curing an injected underfill fluid by performing an injection of an underfill fluid between the lower semiconductor packages 110, and then a heating process. The underfill fluid may include an insulating material such as an epoxy. Further, the underfill fluid may have a low viscosity. Accordingly, the underfill fluid may also be injected in a narrow space without any voids. Further, portions located between the lower semiconductor packages 110 among the underfill portions 160 may be formed in a concave shape as illustrated in FIG. 4E.

Figure 4F:
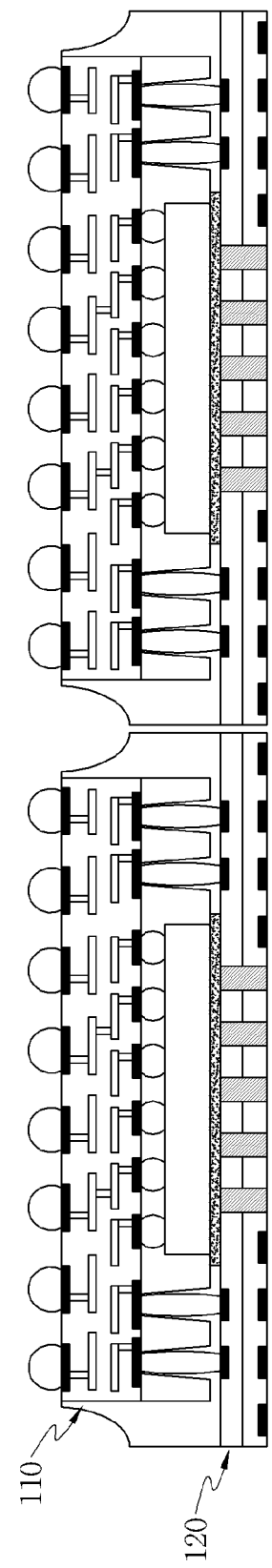

Referring to FIG. 4F, the method of fabricating the semiconductor package stack structure in accordance with the embodiment of the inventive concept may include obtaining the lower semiconductor package 110 on which the interposer substrate 120 is bonded by performing a cutting process on the lower semiconductor packages 110.

Figure 4G:
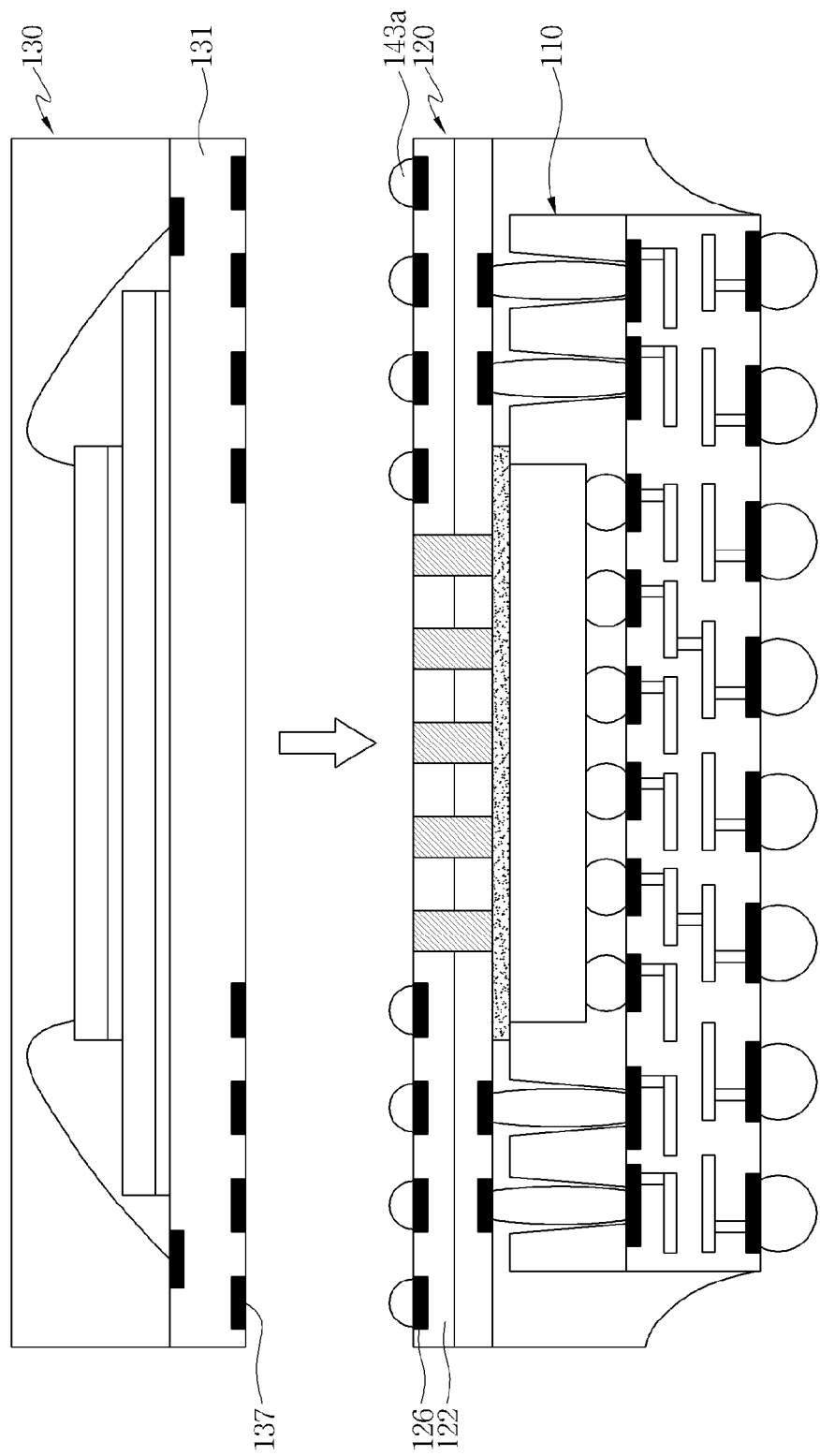

Referring to FIG. 4G, the method of fabricating the semiconductor package stack structure in accordance with the embodiment of the inventive concept may include disposing an upper semiconductor package 130 on the interposer substrate 120. The disposing of the upper semiconductor package 130 on the interposer substrate 120 may include disposing the lower semiconductor package 110 on which the interposer substrate 120 is bonded so that the upper surface of the upper insulating layer 122 of the interposer substrate 120 is facing up, forming third solder balls 143a on second connection pads 126, and disposing the upper semiconductor package 130 in which a lower surface of an upper package substrate 131 is facing the upper insulating layer 122 of the interposer substrate 120. The upper semiconductor package 130 may be stacked on the upper insulating layer 122 of the interposer substrate 120 in an arrow direction.

Referring to FIG. 1A, the method of fabricating the semiconductor package stack structure in accordance with the embodiment of the inventive concept may include bonding the upper semiconductor package 130 on the upper insulating layer 122 of the interposer substrate 120 by performing a reflow process. The third solder balls 143a may be melted by the reflow process and form the upper connection bumps 143 connecting the second connection pads 126 of the interposer substrate 120 to the lower connection pads 137 of the upper semiconductor package 130.

Figure 5:
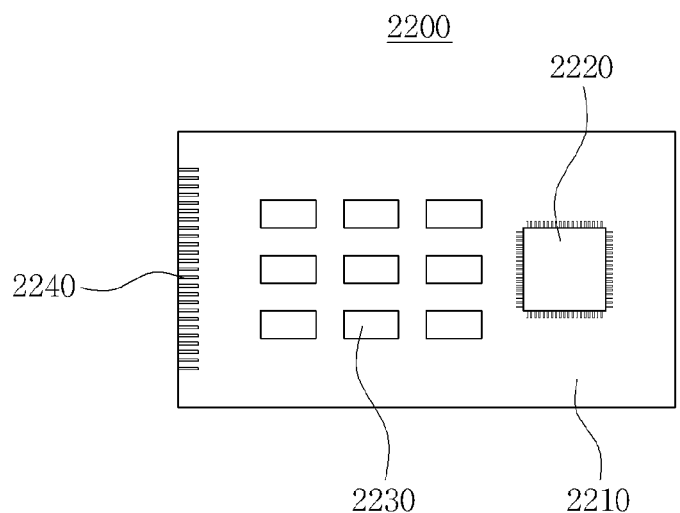
FIGS. 5 to 8 are views conceptually illustrating a module, electronic systems and a mobile wireless phone applying semiconductor package stack structures in accordance with various embodiments of the inventive concept.

FIG. 5 is a view conceptually illustrating a module in accordance with an embodiment of the inventive concept including the semiconductor package stack structures in accordance with various embodiments of the inventive concept. Referring to FIG. 5, a module 2200 in accordance with the embodiment of the inventive concept may include a plurality of semiconductor device 2230 on a module substrate 2210, and the semiconductor device 2230 may include semiconductor package stack structures in accordance with various embodiments of the inventive concept. The module 2200 may further include a microprocessor 2220 mounted on the module substrate 2210. I/O terminals 2240 may be disposed on at least one side of the module substrate 2210. The semiconductor device 2230 may be mounted on the module substrate 2210 by using a flip chip technique.

Figure 6:
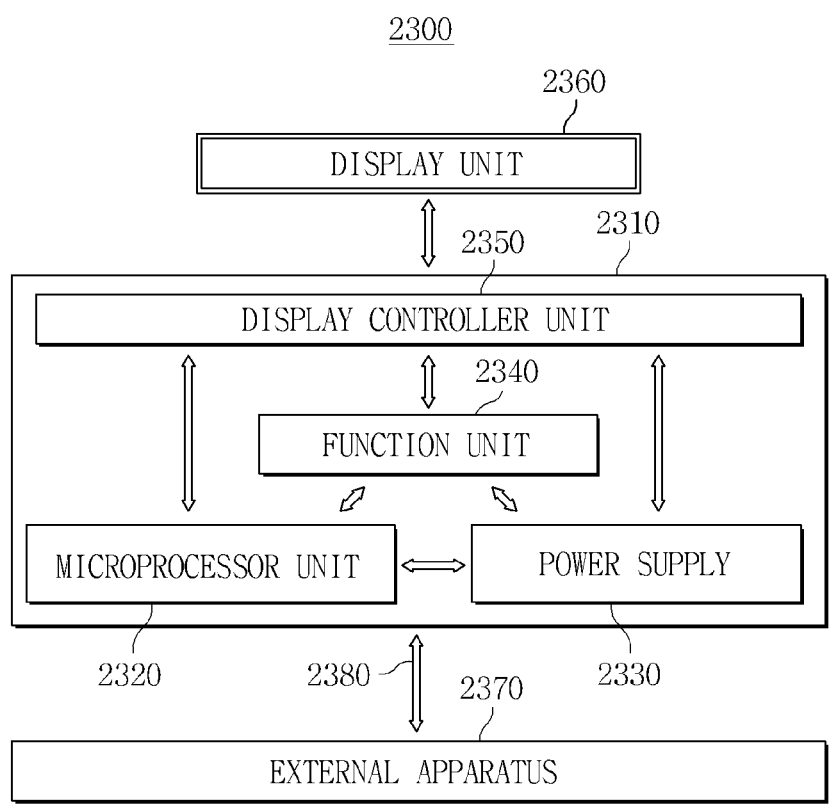

FIG. 6 is a system block diagram for describing an electronic system in accordance with an application embodiment of the inventive concept.

Referring to FIG. 6, the semiconductor package stack structures in accordance with various embodiments of the inventive concept may apply to an electronic system 2300. The electronic system 2300 may include a body 2310, a microprocessor unit 2320, a power supply 2330, a function unit 2340, and a display controller 2350. The body 2310 may include a motherboard formed with a PCB. The body 2310 may include the microprocessor unit 2320, the power supply 2330, the function unit 2340, and the display controller 2350. A display unit 2360 may be disposed inside the body 2310 or outside the body 2310. For example, the display unit 2360 may be disposed on a surface of the body 2310 and display an image processed by the display controller 2350.

The power supply 2330 may receive a constant voltage from an external battery (not shown), divide the voltage into required voltage levels, and serve to supply the voltages to the microprocessor unit 2320, the function unit 2340, and the display controller unit 2350. The microprocessor unit 2320 may receive a voltage from the power supply 2330 and control the function unit 2340 and the display unit 2360. The function unit 2340 may perform various functions of electronic system 2300. For example, when the electronic system 2300 is a mobile phone, the function unit 2340 may include a dialing or various components of mobile functions such as an image output to the display unit 2360 or an audio output to a speaker from communication with an external apparatus 2370, and the function unit 2340 may further serve as a camera image processor when a camera is mounted.

According to an application embodiment, when the electronic system 2300 includes a memory card or the like to expand a storage capacity, the function unit 2340 may serve as a memory card controller. The function unit 2340 may exchange a signal with the external apparatus 2370 via either a wired or wireless communication unit 2380. Furthermore, when the electronic system 2300 needs a Universal Serial Bus (USB) or the like to expand functions, the function unit 2340 may serve as an interface controller. In addition, the function unit 2340 may include a mass capacity storage device. The semiconductor package stack structures in accordance with various embodiments of the inventive concept may be applied to the function unit 2340 or the microprocessor unit 2320.

Figure 7:
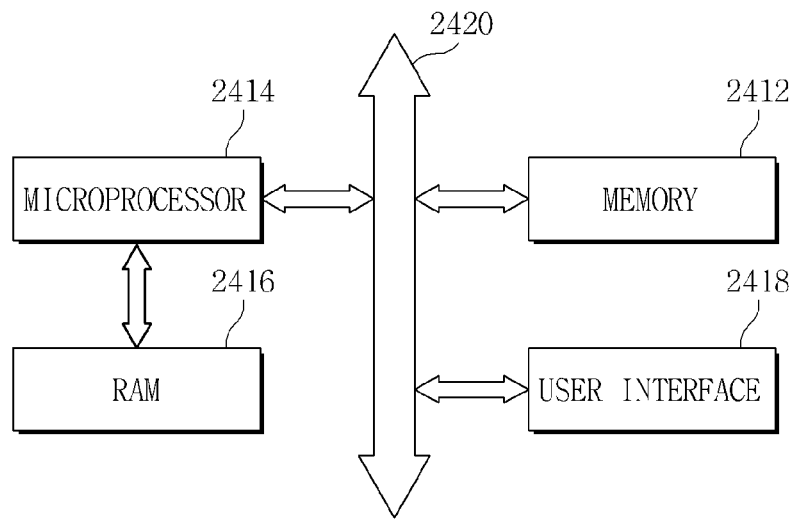

FIG. 7 is a block diagram schematically illustrating another electronic system 2400 including at least one of the semiconductor package stack structures in accordance with various embodiments of the inventive concept.

Referring to FIG. 7, the electronic system 2400 may include at least one of the semiconductor package stack structures in accordance with various embodiments of the inventive concept. The electronic system 2400 may be used for manufacturing a mobile device or a computer. For example, the electronic system 2400 may include a memory 2412, a microprocessor 2414, a RAM 2416, and a user interface 2418. The memory 2412, the microprocessor 2414, and the user interface 2418 may perform data communication using a bus 2420. The microprocessor 2414 may program and control the electronic system 2400. The RAM 2416 may be used as an operational memory of the microprocessor 2414. The microprocessor 2414, the RAM 2416 and/or other components may be assembled in a single package. The memory system 2412 may store operational codes of the microprocessor 2414, data processed by the microprocessor 2414, or external input data. The memory system 2412 may include a controller and a memory.

The semiconductor package stack structures in accordance with various embodiments of the inventive concept may be applied to the microprocessor 2414, the RAM 2416, or the memory 2412.

Figure 8:
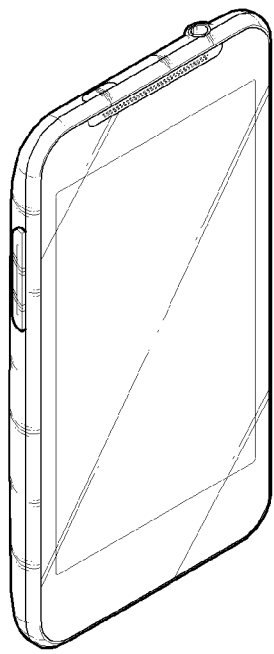

FIG. 8 is a view schematically illustrating a mobile wireless phone 2500 including at least one of the semiconductor package stack structures in accordance with various embodiments of the inventive. The mobile wireless phone 2500 may be understood as a tablet PC. In addition, at least one of the semiconductor package stack structures in accordance with various embodiments of the inventive concept may be used in a portable computer such as a notebook, a mpeg-1 audio player 3 (MP3) player, a MP4 player, a navigation instrument, a solid state disk (SSD), a desktop computer, an automobile, and a home appliance other than the tablet PC.

In the semiconductor package stack structure in accordance with various embodiments of the inventive concept, since an interposer substrate having substantially the same size as an upper semiconductor package may be disposed between a lower and the upper semiconductor packages, a cost may be reduced by reducing the size of the lower semiconductor package and the lower semiconductor package may easily bond to the upper semiconductor packages having different sizes at the same time.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor package stack structure, comprising:
   a lower semiconductor package;
   an interposer substrate disposed on the lower semiconductor package, the interposer substrate having a horizontal width greater than a horizontal width of the lower semiconductor package;
   an upper semiconductor package disposed on the interposer substrate; and
   an underfill portion filling a space between the lower semiconductor package and the interposer substrate, and surround side surfaces of the lower semiconductor package.

2. The semiconductor package stack structure of claim 1, wherein side surfaces of the underfill portion include a first side surface vertically aligned with side surfaces of the interposer substrate, and a second side surface extending from the first side surface and having a slope, respectively.

3. The semiconductor package stack structure of claim 2, wherein the second side surface has a concave shape.

4. The semiconductor package stack structure of claim 2, wherein the second side surface has a linear shape.

5. The semiconductor package stack structure of claim 1, wherein the underfill portion comprises:
   side surfaces vertically aligned with side surfaces of the interposer substrate; and
   a lower surface coplanar with a lower surface of a lower package substrate of the lower semiconductor package.

6. The semiconductor package stack structure of claim 1, wherein the interposer substrate comprises:
   a lower insulating layer;
   an upper insulating layer disposed on the lower insulating layer; and
   thermal vias passing through the lower insulating layer and the upper insulating layer.

7. The semiconductor package stack structure of claim 6, further comprising:
   a heat transfer layer formed between the lower semiconductor package and the thermal vias of the interposer substrate.

8. The semiconductor package stack structure of claim 6, wherein the interposer substrate further includes a core layer disposed between the lower insulating layer and the upper insulating layer, and the thermal vias pass through the core layer.

9. The semiconductor package stack structure of claim 1, further comprising:
   lower connection bumps connecting the lower semiconductor package to the interposer substrate.

10. The semiconductor package stack structure of claim 1, wherein the lower semiconductor package comprises:
    a lower semiconductor chip mounted on an upper surface of a lower package substrate;
    a lower molding member formed on the upper surface of the lower package substrate, and surrounding side surfaces of the lower semiconductor chip;
    chip bumps formed between the lower package substrate and the lower semiconductor chip; and
    external connection terminals formed on a lower surface of the lower package substrate.

11. The semiconductor package stack structure of claim 10, wherein the lower semiconductor chip further includes through silicon vias (TSVs) vertically passing through a body.

12. A semiconductor package stack structure, comprising:
    a lower semiconductor package having a lower package substrate, a lower semiconductor chip mounted on the lower package substrate, and a lower molding member surrounding side surfaces of the lower semiconductor chip on the lower package substrate;
    an upper semiconductor package having an upper package substrate, an upper semiconductor chip mounted on the upper package substrate, and an upper molding member covering side surfaces and upper surfaces of the upper semiconductor chip on the upper package substrate;
    an interposer substrate disposed between the lower semiconductor package and the upper semiconductor package, and having a horizontal width greater than a horizontal width of the lower semiconductor package; and
    an underfill portion filling a space between the lower semiconductor package and the interposer substrate and surrounding side surfaces of the lower semiconductor package.

13. The semiconductor package stack structure of claim 12, further comprising:
    lower connection bumps disposed in the lower molding member, and physically and/or electrically connecting the lower semiconductor package to the interposer substrate.

14. The semiconductor package stack structure of claim 13, wherein a vertical length of each of the lower connection bumps is greater than a vertical length of the lower molding member, and an upper end of each of the lower connection bumps is protruded from an upper surface of the lower molding member.

15. The semiconductor package stack structure of claim 14, wherein the underfill portion surrounds protruded side surfaces of the upper end of each of the lower connection bumps.

16. A semiconductor package stack structure, comprising:
a lower semiconductor package;
an upper semiconductor package disposed on the lower semiconductor package;
an interposer substrate disposed between the lower semiconductor package and the upper semiconductor package; and
an underfill portion filling a space between the interposer substrate and the lower semiconductor package, the underfill portion surrounding side surfaces of the lower semiconductor package,
wherein an area of the interposer substrate is greater than an area of the lower semiconductor package in a top view.

17. The semiconductor package stack structure according to claim 16, wherein side surfaces of the underfill portion include a portion vertically aligned with side surfaces of the interposer substrate and a sloped portion, respectively.

18. The semiconductor package stack structure of claim 16, wherein the area of the interposer substrate is the same as an area of the upper semiconductor package in a top view.

19. The semiconductor package stack structure of claim 16, further comprising:
lower connection bumps connecting the lower semiconductor package to the interposer substrate; and
upper connection bumps connecting the upper semiconductor package to the interposer substrate.

20. The semiconductor package stack structure of claim 19, wherein upper surface of each of the lower connection bumps is at a higher level than an upper surface of the lower semiconductor package.

* * * * *